United States Patent
Sherwood

(10) Patent No.: US 7,402,273 B2
(45) Date of Patent: Jul. 22, 2008

(54) FLASH CURING IN SELECTIVE DEPOSITION MODELING

(75) Inventor: Michael Thomas Sherwood, Agoura Hills, CA (US)

(73) Assignee: 3D Systems, Inc., Rock Hill, SC (US)

( * ) Notice: Subject to any disclaimer, the term of this patent is extended or adjusted under 35 U.S.C. 154(b) by 0 days.

(21) Appl. No.: 11/133,060

(22) Filed: May 19, 2005
(Under 37 CFR 1.47)

(65) Prior Publication Data

US 2005/0253308 A1    Nov. 17, 2005

Related U.S. Application Data

(62) Division of application No. 10/140,426, filed on May 7, 2002, now Pat. No. 7,270,528.

(51) Int. Cl.
*B29C 35/08*    (2006.01)
*B29C 41/02*    (2006.01)

(52) U.S. Cl. .................................. 264/494; 264/308

(58) Field of Classification Search ............. 264/308, 264/401, 494, 496
See application file for complete search history.

(56) References Cited

U.S. PATENT DOCUMENTS

| | | | |
|---|---|---|---|
| 3,930,064 A * | 12/1975 | Sander | ................ 427/492 |
| 5,096,530 A | 3/1992 | Cohen | |
| 5,136,515 A | 8/1992 | Helinski | |
| 5,204,055 A | 4/1993 | Sachs et al. | |
| 5,216,616 A | 6/1993 | Masters | |
| 5,340,433 A | 8/1994 | Crump | |
| 5,340,656 A | 8/1994 | Sachs et al. | |
| 5,340,701 A | 8/1994 | Desobry | |
| 5,380,769 A | 1/1995 | Titterington et al. | |
| 5,555,176 A | 9/1996 | Menhennett et al. | |
| 5,656,230 A * | 8/1997 | Khoshevis | ................ 264/401 |
| 5,855,836 A | 1/1999 | Leyden et al. | |
| 5,866,058 A | 2/1999 | Batchelder et al. | |
| 6,132,665 A | 10/2000 | Bui et al. | |

(Continued)

FOREIGN PATENT DOCUMENTS

WO    WO 97/11837    4/1997

(Continued)

OTHER PUBLICATIONS

"Design Consideration for High-Stability Pulsed Light Systems," by Robert A. Capobianco, from website: http://opto.perkinelmer.com/library/papers/tp1.htm. (undated).

(Continued)

*Primary Examiner*—Leo B Tentoni
(74) *Attorney, Agent, or Firm*—William A. Simons

(57) ABSTRACT

A flash curing system for solid freeform fabrication which generates a plurality of radiation emitting pulses that forms a planar flash. The planar flash initiates curing of a curable material dispensed by a solid freeform fabrication apparatus. The radiation emitting pulses have a high peak power value that releases a sufficient quantity of free radicals from the photoinitiator to initiate curing and overcome the problem of oxygen inhibition. Substantially less power is consumed and less heat generated by the flash curing system compared to conventional continuous emission curing systems.

31 Claims, 5 Drawing Sheets

U.S. PATENT DOCUMENTS

| | | | |
|---|---|---|---|
| 6,133,355 | A | 10/2000 | Leyden et al. |
| 6,259,962 | B1 | 7/2001 | Gohait |
| 6,492,651 | B2 | 12/2002 | Kerekes |
| 6,562,269 | B2 | 5/2003 | Fong |
| 6,752,948 | B2 | 6/2004 | Newell et al. |
| 6,841,116 | B2 | 1/2005 | Schmidt |
| 6,841,589 | B2 | 1/2005 | Schmidt et al. |
| 6,936,212 | B1 * | 8/2005 | Crawford ................ 264/308 |
| 2002/0016386 | A1 | 2/2002 | Napadensky |
| 2003/0063138 | A1 | 4/2003 | Fong |
| 2003/0067098 | A1 | 4/2003 | Newell et al. |

FOREIGN PATENT DOCUMENTS

| | | |
|---|---|---|
| WO | WO 00/11092 | 3/2000 |
| WO | WO 01/26023 | 4/2001 |
| WO | WO 01/68375 | 9/2001 |

OTHER PUBLICATIONS

Vurdering of UV-haerdende trykfarver og —lakker 1 et samlet miljoperspektiv (translated as—"Evaluation of UV Hardened Printer's Ink and Lacquer in a Comprehensive Environmental Perspective," by the Danish Environmental Protection Agency, published 1999, website www.mst.dk/udgiv/publikationer/1999/87-7909-190-3/html/samfat_eng.htm.

"UV-Flash Curing and Its Applications," by A. Stohr and J. Renschke, website http://www.radcurenet.de/rte99/stoehr/stoehr.htm. (undated).

"How UV Flash Curing Works," by Sylve Ericsson, Svecia USA Inc., website http://www.screenweb.com/graphics/cont/flashuv2.htm. (undated).

"Optical Pump Sources," website http://repairfaq.physik.tu-berlin.de/sam/laserssl.htm#sslsfm. (undated).

"Application of a Flash Lamp Apparatus for DVD Bonding Process," by Shoei Ebisawa, Koyshi Ohshima, Norio Tunematu, and Keiichi Hashimoto, website: http://www.dic.co.jp/tech/rep0403/, Rad Tech Asia 1997.

* cited by examiner

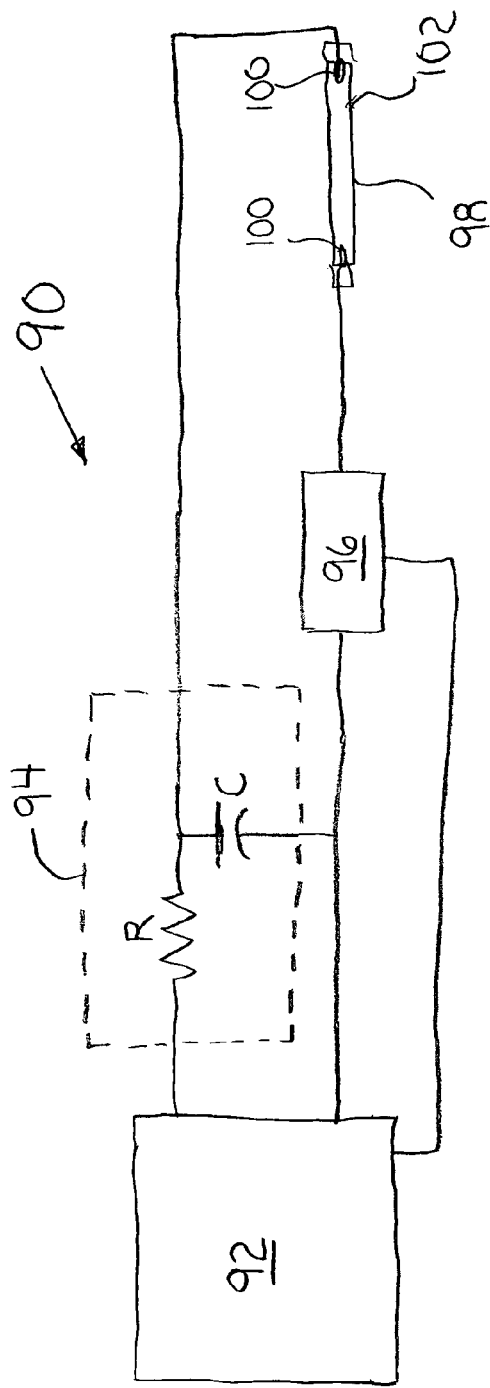
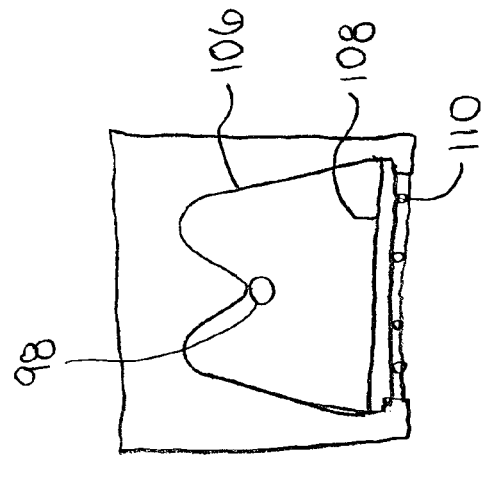
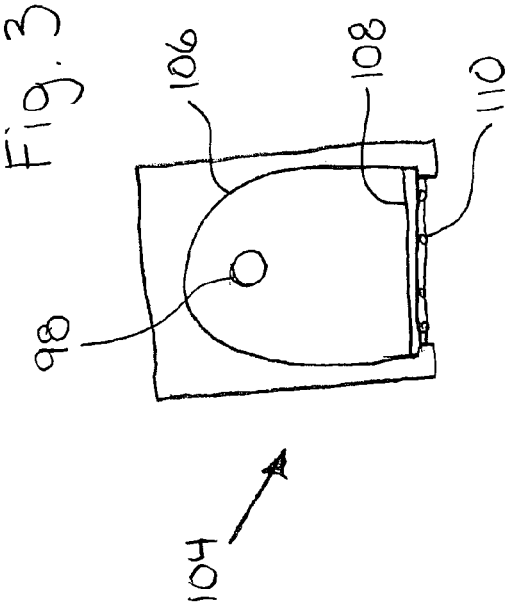

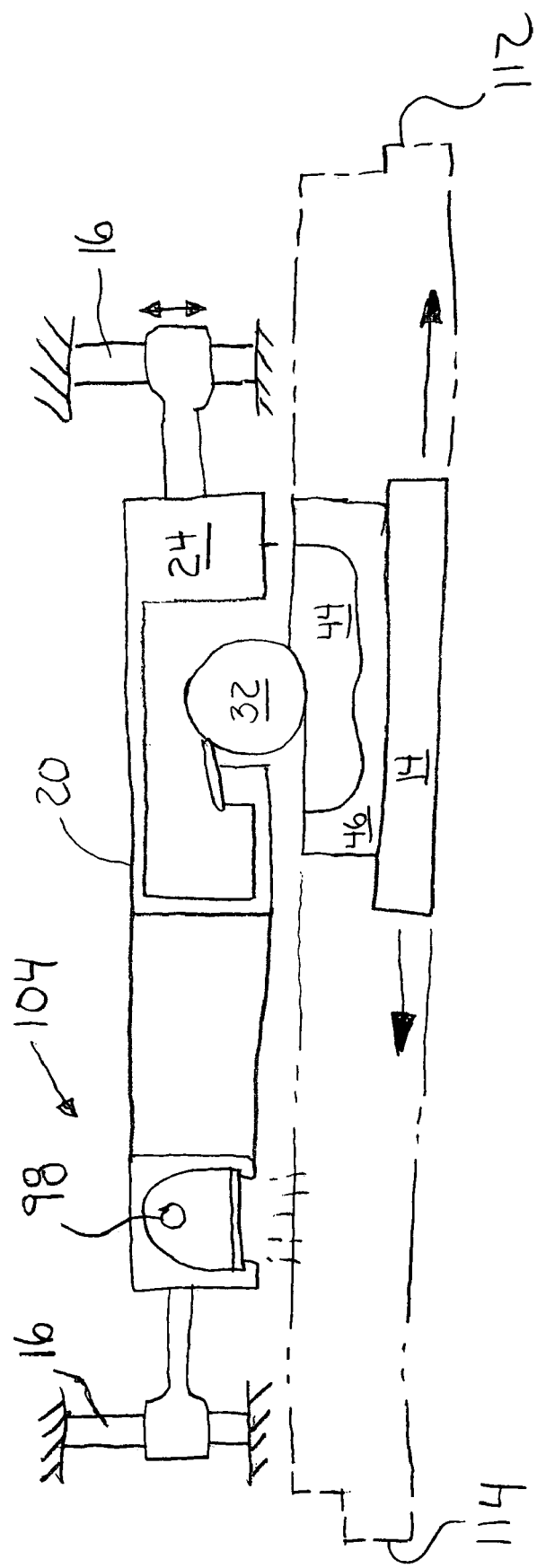

FLASH CURING IN SELECTIVE DEPOSITION MODELING

This application is a division of application Ser. No. 10/140,426 filed on May 7, 2002 now U.S. Pat. No. 7,270,528.

BACKGROUND OF THE INVENTION

1. Field of the Invention

The invention relates in general to solid deposition modeling, and in particular to a method and apparatus for providing a planar flash to cure layers of a build material to form a three-dimensional object. The flash curing system substantially eliminates the problem of oxygen inhibition encountered when attempting to cure thin layers exposed to air.

2. Description of the Prior Art

Recently, several new technologies have been developed for the rapid creation of models, prototypes, and parts for limited run manufacturing. These new technologies are generally called Solid Freeform Fabrication techniques, and are herein referred to as "SFF." Some SFF techniques include stereolithography, selective deposition modeling, laminated object manufacturing, selective phase area deposition, multiphase jet solidification, ballistic particle manufacturing, fused deposition modeling, particle deposition, laser sintering, and the like. Generally in SFF techniques, complex parts are produced from a modeling material in an additive fashion as opposed to conventional fabrication techniques, which are generally subtractive in nature.

In most SFF techniques, structures are formed in a layer by layer manner by solidifying or curing successive layers of a build material. For example, in stereolithography a tightly focused beam of energy, typically in the ultraviolet radiation band, is scanned across a layer of a liquid photopolymer resin to selectively cure the resin to form a structure. In Selective Deposition Modeling, herein referred to as "SDM," a build material is typically jetted or dropped in discrete droplets, or extruded through a nozzle, in order to solidify on contact with a build platform or previous layer of solidified material in order to build up a three-dimensional object in a layerwise fashion. Other synonymous names for SDM which are used in this industry are solid object imaging, solid object modeling, fused deposition modeling, selective phase area deposition, multi-phase jet modeling, three-dimensional printing, thermal stereolithography, selective phase area deposition, ballistic particle manufacturing, fused deposition modeling, and the like. Ballistic particle manufacturing is disclosed in, for example, U.S. Pat. No. 5,216,616 to Masters. Fused deposition modeling is disclosed in, for example, U.S. Pat. No. 5,340,433 to Crump. Three-dimensional printing is disclosed in, for example, U.S. Pat. No. 5,204,055 to Sachs et al. Often a thermoplastic material having a low-melting point is used as the solid modeling material in SDM, which is delivered through a jetting system such as an extruder or print head. One type of SDM process which extrudes a thermoplastic material is described in, for example, U.S. Pat. No. 5,866,058 to Batchelder et al. One type of SDM process utilizing ink jet print heads is described in, for example, U.S. Pat. No. 5,555,176 to Menhennett et al.

Recently, there has developed an interest in utilizing curable materials in SDM. One of the first suggestions of using a radiation curable build material in SDM is found in U.S. Pat. No. 5,136,515 to Helinski, wherein it is proposed to selectively dispense a UV curable build material in an SDM system. Some of the first UV curable material formulations proposed for use in SDM systems are found in Appendix A of International Patent Publication No. WO 97/11837, where three reactive material compositions are provided. More recent teachings of using curable materials in various selective deposition modeling systems are provided in U.S. Pat. No. 6,259,962 to Gothait; U.S. Pat. No. 5,380,769 to Titterington et al; U.S. Pat. Nos. 6,133,355 and 5,855,836 to Leyden et al; U.S. Pat. App. Pub. No. U.S. 2002/0016386 A1; and International Publication Numbers WO 01/26023, WO 00/11092, and WO 01/68375.

These curable materials generally contain photoinitiators and photopolymers which, when exposed to ultraviolet radiation (UV), begin to cross-link and solidify. Often these curable materials contain non-curable components, which enable the materials to solidify after being dispensed prior to being cured. This is generally needed so that the selectively dispensed material will maintain its shape before being exposed to ultraviolet radiation.

For SDM systems that selectively dispense curable materials, it is desirable to initiate curing of the dispensed material by a flood exposure to UV radiation. However, developing a flood UV exposure system that effectively initiates curing in these materials proven problematic. When the photoinitiators in the thin layers are excited by exposure to UV radiation, they release free radicals that are intended to react with the photopolymers and initiate the polymerization (curing) process. Because of the wide area of exposure of these thin layers to the atmosphere, the free radicals tend to react with the oxygen in the atmosphere instead of reacting with the photopolymers to initiate curing. This cure-hindering phenomena is known as oxygen inhibition, which can undesirably reduce or prevent the polymerization process from occurring. Oxygen inhibition is effectively non-existent in stereolithography since the tightly focused beam of UV radiation triggers a large instantaneous release of free radicals over a small region. The region is so small the free radicals lack the opportunity to react with the oxygen in the atmosphere. However, oxygen inhibition is a significant problem in SDM applications where a broad planar flood exposure is desired to initiate the curing process. Although this phenomena can be overcome by submersing the SDM build environment in an inert gas, providing such a system only adds additional complexity and expense to an SDM system that is to be avoided.

Most UV lamps used in curing photopolymers that provide a planar exposure of UV radiation are typically mercury-halide lamps, metal halide lamps, or mercury-xenon lamps. These lamps are continuous running lamps that generate high levels of heat in order to produce the levels of UV radiation necessary to trigger polymerization. Undesirably, the high levels of heat generated by these lamps pose significant problems in SDM. For instance, the heat generated by these lamps can thermally initiate curing of the material in the SDM dispensing device or material delivery system rendering the apparatus inoperable. Alternatively, the heat may also prevent the dispensed material from solidifying prior to being exposed to UV radiation. Undesirably, if these continuously emitting lamps are to be used, the high levels of heat they generate may require special active cooling systems to be incorporated into the system to make the system operable. Not only is the amount of power consumed by these lamps to maintain the emission substantial, but they also have long warm up times which necessitates that they be operated continuously. Thus, they typically require some sort of mechanical shutter system in order to control the duration of the exposure in SDM systems while the lamps are operated continuously. Further, experiments with continuous UV emitting lamps not only demonstrated that they consume significant amounts of power, typically around 1500 Watts, but also that many curable formulations would not cure due to oxygen inhibition.

Recently there has come available flash curing systems which generate high peak power pulses of ultraviolet radiation for curing. Although these commercially available systems are capable of overcoming the problem of oxygen inhibition, they are generally not practical for use in SDM. For example, commercially available power supplies for use in charging these pulse systems have large input power requirements, often around 40 kilowatts or more. These power supplies, initially designed to power laser systems, need more than about 1000 watts of input power to operate, and typically require a line voltage of 240 VAC or greater. Thus, these flash curing systems operate at power levels that are too high to be useful in SDM systems. For SDM applications a lower power consumption flash curing system is needed, but not available.

Thus, there is a need to develop an inexpensive, low power, flash curing system for SDM capable of initiating polymerization of selectively dispensed curable materials without detrimentally effecting the layer-by-layer SDM build process. These and other difficulties of the prior art have been overcome according to the present invention.

BRIEF SUMMARY OF THE INVENTION

The present invention provides its benefits across a broad spectrum. While the description which follows hereinafter is meant to be representative of a number of such applications, it is not exhaustive. As will be understood, the basic methods and apparatus taught herein can be readily adapted to many uses. It is intended that this specification and the claims appended hereto be accorded a breadth in keeping with the scope and spirit of the invention being disclosed despite what might appear to be limiting language imposed by the requirements of referring to the specific examples disclosed.

It is one aspect of the present invention to cure a layer of curable material in a solid freeform fabrication apparatus by exposing the layer to a planar flash of radiation.

It is another aspect of the present invention to provide a flash curing system for a solid freeform fabrication apparatus that is not continuously powered during the layerwise formation of three-dimensional objects.

It is a feature of the present invention that a planar flash of radiation is generated comprising a plurality of radiation emitting pulses.

It is another feature of the present invention to direct the radiation emitting pulses to a desired area within a build environment of a solid freeform fabrication apparatus.

It is an advantage of the present invention that both power consumption and heat generation are substantially reduced when curing a material by exposure to a planar flash of radiation.

It is another advantage of the present invention that oxygen inhibition is overcome when curing thin layers of curable materials by exposure to a broad planar flash of radiation.

These and other aspects, features, and advantages are achieved/attained in the method and apparatus of the present invention. The method of the present invention comprises generating computer data corresponding to layers of the object, dispensing a curable material in the build environment according to the computer data to form layers of the object, supporting the dispensed material in the build environment; and exposing the dispensed material to at least one planar flash of radiation to cure the dispensed material. The planar flash comprises a plurality of radiation emitting pulses that initiate curing of the dispensed material.

The selective deposition modeling apparatus of the present invention comprises a support means, dispensing means, and flash exposure means. The support means is affixed to the apparatus for supporting the three-dimensional object in the build environment. The dispensing means is affixed to the apparatus and in communication with the support means for dispensing the curable material in the build environment according to the computer data to form the layers of the three-dimensional object. The flash exposure means is affixed to the apparatus and in communication with the support means for exposing the dispensed material in the build environment to at least one planar flash of radiation. The planar flash comprises a plurality of radiation emitting pulses that initiate curing of the dispensed material.

A flash curing system of the present invention comprises at least one flash lamp, a pulse-forming network, trigger, and power supply. The flash lamp produces at least one planar flash comprising a plurality of radiation emitting pulses. The pulse-forming network is operably connected to the flash lamp for providing the excitation energy to the flash lamp to generate the plurality of radiation emitting pulses. The excitation energy for each radiation emitting pulse is between about 1 and about 15 joules at a direct current voltage of about 2250 volts or less. The trigger is operably connected between said flash lamp and the pulse-forming network for initiating delivery of the excitation energy from the pulse-forming network to the flash lamp to generate each pulse. The power supply is operably connected to the pulse-forming network for initially supplying the excitation energy and re-supplying the excitation energy to the pulse-forming network prior to each pulse. Desirably the power supply consumes less than about 1000 watts of power, more preferably less than about 800 watts, even more preferably less than about 600 watts, and most preferably less than about 500 watts.

BRIEF DESCRIPTION OF THE DRAWINGS

The aspects, features, and advantages of the present invention will become apparent upon consideration of the following detailed disclosure of the invention, especially when it is taken in conjunction with the accompanying drawings wherein:

FIG. 3 is an electrical schematic of the present invention flash curing system.

FIG. 4 is a cross-sectional view of reflector housing assembly for the present invention flash curing system.

FIG. 5 is a cross-sectional view of another reflector housing assembly for the present invention flash curing system.

FIG. 6 is a diagrammatic side view of the solid deposition modeling apparatus of FIG. 3 shown in conjunction with the reflector housing assembly of FIG. 4.

To facilitate understanding, identical reference numerals have been used, where possible, to designate identical elements that are common in the figures.

DETAILED DESCRIPTION OF THE PREFERRED EMBODIMENTS

Figure 1:
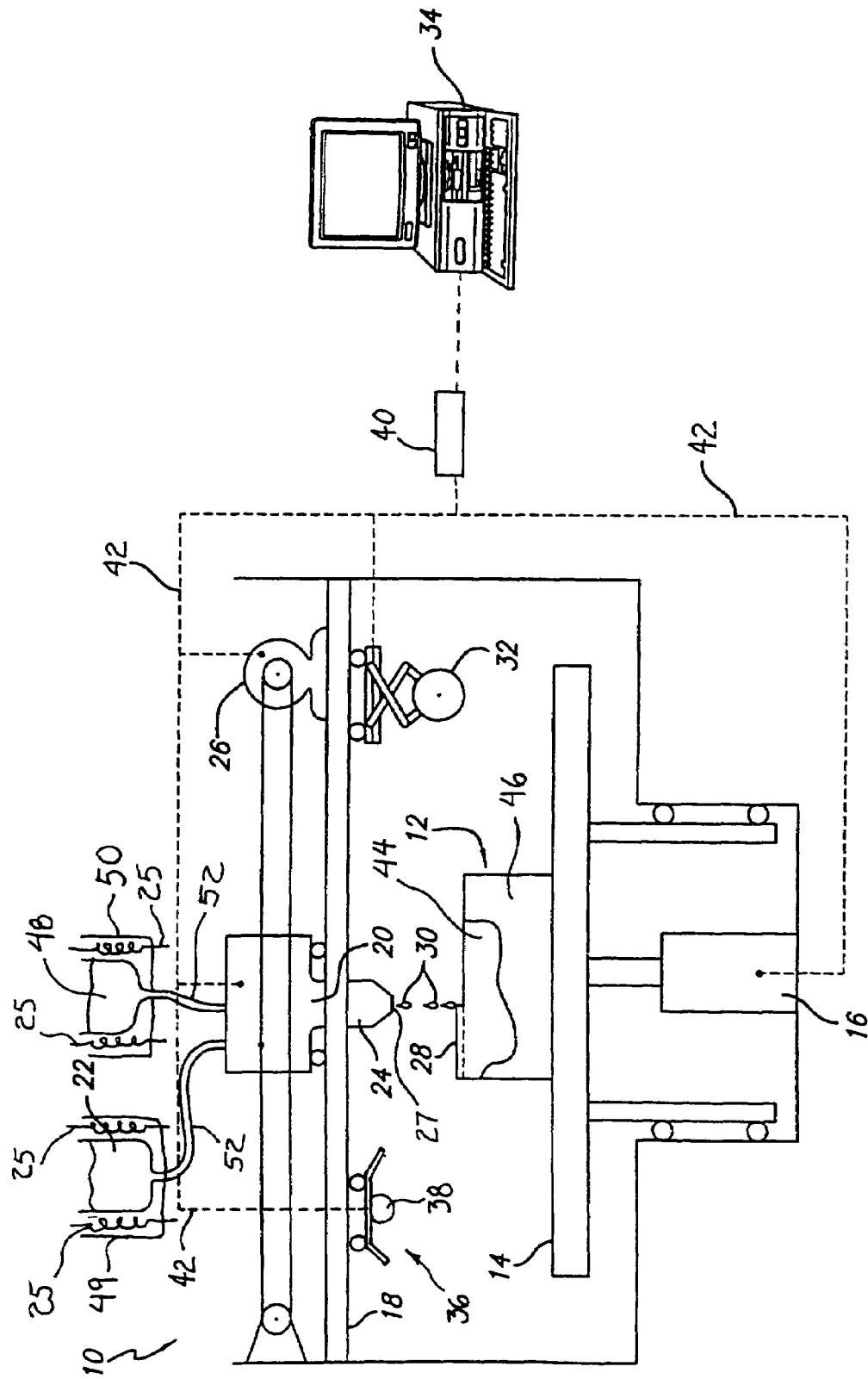
FIG. 1 is a diagrammatic side view of a solid deposition modeling apparatus incorporating the present invention flash curing system.

While the flash curing system of the present invention is applicable to all SFF techniques that could utilize in using a planar flash curing system to cure a build material, the invention will be described with respect to an SDM technique utilizing an ink jet print head dispensing a ultraviolet radiation curable phase change material. However, it is to be appreciated that the present invention flash curing system can be implemented with any SFF technique utilizing a wide variety of curable materials. For example, the curable material can be cured by exposure to radiation having wavelengths other than in the ultraviolet band of the spectrum, if desired.

As used herein, the term "a flowable state" of a build material is a state wherein the material is unable to resist shear stresses that are induced by a dispensing device, such as those induced by an ink jet print head when dispensing the material, causing the material to move or flow. Preferably, the flowable state of the build material is a liquid state, however, the flowable state of the build material may also exhibit thixotropic-like properties. The term "solidified" and "solidifiable" as used herein refer to the phase change characteristics of a material where the material transitions from the flowable state to a non-flowable state. A "non-flowable state" of a build material is a state wherein the material is sufficiently self-supportive under its own weight so as to hold its own shape. A build material existing in a solid state, a gel state, or paste state, are examples of a non-flowable state of a build material for the purposes herein. In addition, the term "cured" or "curable" refers to any polymerization reaction. Preferably, the polymerization reaction is triggered by controlled exposure to actinic radiation or thermal heat. Most preferably, the polymerization reaction involves the cross-linking of monomers and oligomers initiated by exposure to actinic radiation in the ultraviolet wavelength band. Further, the term "cured state" refers to a material, or portion of a material, in which the polymerization reaction has substantially completed. It is to be appreciated that as a general matter the material can easily transition between the flowable and non-flowable state prior to being cured; however, once cured, the material cannot transition back to a flowable state and be dispensed by the apparatus.

It has been discovered that it is desirable to maintain low temperatures in SDM systems that dispense radiation curable materials, such as around 40° C. This is due to a variety of related reasons, of which the most significant reason is to prevent thermal initiation of the cure process when the material is in the flowable state prior to being dispensed. This is to be avoided since thermal initiation of the cure process can clog the print head, or other dispensing device, causing the apparatus to malfunction. Still further, maintaining lower temperatures in the SDM system is important since the polymerization cure process produces a significant amount of exothermal heat from the three-dimensional object being formed. This heat, in addition to the heat already present in the material after solidification of previous layers, must be kept to a minimum and/or be removed so that subsequent layers of dispensed material will be able to solidify after being dispensed and not remain in the flowable state and run off the object.

The SDM apparatus incorporating the flash curing system of the present invention dispenses a curable phase change material from a piezoelectric Z850 print head available from Xerox Corporation of Wilsonville, Oreg. although other dispensing devices could be used, if desired. The material dispensed from the Z850 print head desirably has a viscosity of between about 13 to about 14 centipoise at a dispensing temperature of about 80° C. The dispensing methodology of this system is described in greater detail in U.S. Pat. No. 6,841,116 assigned to the assignee of the present invention.

A number of radiation curable phase change formulations were developed to be dispensed by the Z850 print head. The components of four exemplary build material formulations are provided by weight percent in Table 1.

TABLE 1

| Mfg. ID No. | General Component Name | Ex. 1 | Ex. 2 | Ex. 3 | Ex. 4 |
|---|---|---|---|---|---|
| CN980 | Urethane Acrylate | 7.2% | | | 6.5% |
| CN981 | Urethane Acrylate | | | 26% | |
| E3200 | Epoxy Acrylate | | | 14% | 6.0% |
| CN975 | Hexafunctional Urethane Acrylate | | 7.2% | | |
| CN2901 | Urethane Acrylate | 27.5% | 27% | | 18.7% |
| SR203 | Tetrahydrofurfuryl Methacrylate | | | | |
| SR205 | Triethylene glycol dimethacrylate | 33% | | 46.5% | 41.05% |
| SR340 | 2-phenoxyethyl methacrylate | | | | |
| SR313 | Lauryl methacrylate | | 18% | | |
| SR454 | Ethoxylated₃ Trimethylolpropane Triacrylate | | 4.5% | | |
| SR604 | polypropylene glycol monomethacrylate | | | | 12.0% |
| CD406 | Cyclohexane dimethanol diacrylate | | 30% | | |
| SR493D | Tridecyl Methacrylate | 19% | | | |
| ADS038 | Urethane wax | 7% | 5.3% | 10% | 10.0% |
| ADS043 | Urethane wax | 4.3% | 6% | 1.5% | 2.0% |
| I-184 | Photo-initiator | 2% | 2% | 2% | 3.75% |
| TOTAL | | 100% | 100% | 100% | 100.0% |

The following components used in the four formulations listed in Table 1 are available from Sartomer Company, Inc. of Exton Pa. under the following designations: CN 980, CN 981, CN 975, CN2901, SR 203, SR 205, SR 340, SR 313, SR 454, CD 406, SR604, and SR 493D. The components ADS 038 and ADS 043 are available from American Dye Source, Inc. of Quebec, Canada. The epoxy acrylate under the designation E 3200 is available from UCB Chemical, Inc. of Atlanta, Ga. The photoinitiator under the designation I-184 listed is available from Ciba Specialty Chemicals, Inc. of New York, N.Y. The formulation in example 4 of Table 1 is preferred since it was determined to be the most durable.

A non-curable phase change support material was also developed to be dispensed from the same print head as the curable phase change build material. The support material formulation comprises 70% by weight octadecanol available from Ruger Chemical Co., Inc., of Irvington, N.J., and 30% by weight of a tackifier sold under the designation of KE 100 available from Arakawa Chemical (USA) Inc., of Chicago, Ill. Further details pertaining to the build and support materials are found in U.S. patent application Ser. No. 09/971,247 assigned to the assignee of the present invention.

The support material may alternatively be a thermoplastic phase change material such as that disclosed in U.S. Pat. No. 6,132,665 to Bui et al. Alternatively, the support material may be a water-soluble material, if desired, which may include a fluorosurfactant to lower the surface tension of the material to improve the drop shape and cohesion of the jetted material. In addition, the material may be a gel material, such as gelatin that can be wiped away from the object, if desired. In addition, the support material may exhibit mechanically weak properties so it can be easily crumbled away from the three-dimensional object.

Referring particularly to FIG. 1 there is illustrated generally by the numeral 10 an SDM apparatus incorporating an embodiment of the flash curing system of the present invention. The SDM apparatus 10 is shown building a three-dimensional object 44 on a support structure 46 in a build environment shown generally by the numeral 12. The object 44 and support structure 46 are built in a layer by layer manner on a build platform 14 that can be precisely positioned vertically by any conventional actuation means 16. Directly above and parallel to the platform 14 is a rail system 18 on which a material dispensing trolley 20 resides carrying a dispensing device 24. Preferably, the dispensing device 24 is an ink jet print head that dispenses a build material and support material and is of the piezoelectric type having a plurality of dispensing orifices. However, other ink jet print head types could be used, such as an acoustic or electrostatic type, if desired. Alternatively a thermal spray nozzle could be used instead of an ink jet print head, if desired.

The trolley carrying the dispensing device 24 is fed the curable phase change build material 22 from a remote reservoir 49. The remote reservoir is provided with heaters 25 to bring and maintain the curable phase change build material in a flowable state. Likewise, the trolley carrying the dispensing device 24 is also fed the non-curable phase change support material from remote reservoir 50 in the flowable state. In order to dispense the materials, a heating means is provided to initially heat the materials to the flowable state, and to maintain the materials in the flowable state along its path to the print head. The heating means comprises heaters 25 on both reservoirs 49 and 50, and additional heaters (not shown) on the umbilicals 52 connecting the reservoirs to the dispensing device 24. Located on the dispensing device 24 is a plurality of discharge orifices 27 for dispensing both the build material and support material, although just one orifice is shown in FIG. 1. Each discharge orifice is dedicated to dispense either the build material or the support material in a manner that either material can be dispensed to any desired target location in the build environment.

The dispensing device 24 is reciprocally driven on the rail system 18 along a horizontal path by a conventional drive means 26 such as an electric motor. Generally, the trolley carrying the dispensing device 24 takes multiple passes to dispense one complete layer of the materials from the discharge orifices 27. In FIG. 1, a portion of a layer 28 of dispensed build material is shown as the trolley has just started its pass from left to right. A dispensed droplets 30 are shown in mid-flight, and the distance between the discharge orifice and the layer 28 of build material is greatly exaggerated for ease of illustration. The layer 28 may be all build material, all support material, or a combination of build and support material, as needed, in order to form and support the three-dimensional object.

The build material and support material are dispensed as discrete liquid droplets 30 in the flowable state, which solidify upon contact with the layer 28 as a result of a phase change. Alternatively, the materials may be dispensed in a continuous stream in an SDM system, if desired. Each layer of the object is divided into a plurality of pixels on a bit map, in which case a target location is assigned to the pixel locations of the object for depositing the curable phase change material 22. Likewise, pixel coordinates located outside of the object may be targeted for deposition of the non-curable phase change support material 48 to form the supports for the object as needed. Generally, once the discrete liquid droplets are deposited on all the targeted pixel locations of the bit map for a given layer, the dispensing of material for forming the layer is complete, and an initial layer thickness is established. Preferably the initial layer thickness is greater than the final layer thickness.

A planarizer 32 is then drawn across the layer to smooth the layer and normalize the layer to establish the final layer thickness. The planarizer 32 is used to normalize the layers as needed in order to eliminate the accumulated effects of drop volume variation, thermal distortion, and the like, which occur during the build process. It is the function of the planarizer to melt, transfer, and remove portions of the dispensed layer of build material in order to smooth it out and set a desired thickness for the last formed layer prior to curing the material. This ensures a uniform surface topography and layer thickness for all the layers that form the three-dimensional object, however, it produces waste material that must be removed from the system. The planarizer 32 may be mounted to the material dispensing trolley 20 if desired, or mounted separately on the rail system 18, as shown. Alternatively, the layers can be normalized by utilizing capillary action to remove excess material, as disclosed in U.S. Pat. No. 6,562,269 assigned to the assignee of the present invention, or an active surface scanning system that provides feedback data that can be used to selectively dispense additional material in low areas to form a uniform layer as disclosed in U.S. Pat. No. 6,492,651 also assigned to the assignee of the present invention.

A waste collection system (not shown in FIG. 1) is used to collect the excess material generated during planarizing. The waste collection system may comprise an umbilical that delivers the material to a waste tank or waste cartridge, if desired. A preferred waste system for curable phase change materials is disclosed in U.S. patent application Ser. No. 09/970,956, assigned to the assignee of the present invention.

The flash curing system of the present invention is generally shown by numeral 36 mounted on rail system 18. The flash curing system 36 is reciprocally driven along rail system 18 to scan the radiation source over a just dispensed layer of material. The flash curing system 36 includes an ultraviolet radiation emitting xenon flash bulb 38 which is used to provide a planar (flood) exposure of UV radiation to each layer as needed. The exposure is executed in a flash manner, with the planarizer retracted from the build area when the flash occurs. Although the flash curing system 36 is shown reciprocally mounted on rail system 18, it may be mounted directly on the dispensing trolley, if desired. It is important to shield the print head and planarizer from exposure by the flash curing system so as to prevent curing material in the dispensing orifices or on the surface of the planarizer, either of which would ruin the build process and damage the apparatus.

Preferably, an external computer 34 generates or is provided with a solid modeling CAD data file containing three-dimensional coordinate data of an object to be formed. Typically the computer 34 converts the data of the object into surface representation data, most commonly into the STL file format. In the preferred embodiment, the computer also establishes data corresponding to support regions for the object. When a user desires to build an object, a print command is executed at the external computer in which the STL file is processed, through print client software, and sent to the computer controller 40 of the SDM apparatus 10 as a print job. The processed data transmitted to the computer controller 40 can be sent by any conventional data transferable medium desired, such as by magnetic disk tape, microelectronic memory, network connection, or the like. The computer controller processes the data and executes the signals that operate the apparatus to form the object. The data transmission route and controls of the various components of the SDM apparatus are represented as dashed lines at 42.

Once the three-dimensional object is formed, the support material is removed by further processing. Generally, application of thermal heat to bring the support material back to a flowable state is needed to remove substantially all of the support material from the three-dimensional object. This can be accomplished in a variety of ways. For example, the part can be placed in a heated vat of liquid material such as in water or oil. Physical agitation may also be used, such as by directing a jet of the heated liquid material directly at the support material. This can be accomplished by steam cleaning with appropriate equipment. Alternatively, the support material can also be removed by submersing the material in an appropriate liquid solvent to dissolve the support material. Specific details on support material removal is disclosed in U.S. Pat. No. 6,752,948 and U.S. patent application Ser. No. 10/084,726 filed Feb. 25, 2002 entitled "Post Processing three-dimensional objects formed by solid freeform fabrication," both assigned to the assignee of the present invention.

Figure 2:
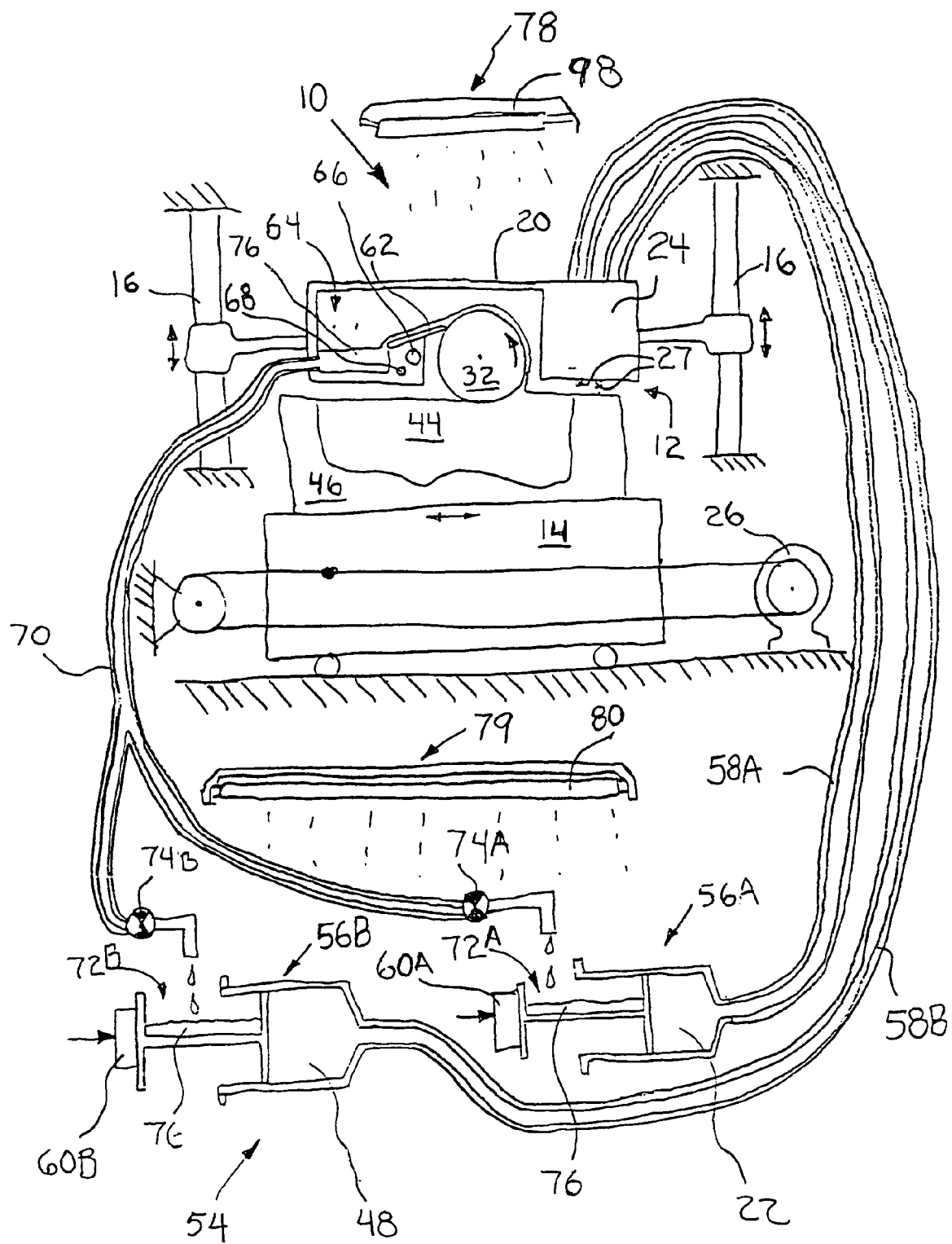
FIG. 2 is a diagrammatic side view of a preferred solid deposition modeling apparatus incorporating the present invention flash curing system.

Referring to FIG. 2 there is illustrated generally by the numeral 10 another SDM apparatus incorporating an embodiment of the flash curing system of the present invention. This apparatus 10 is shown including schematically a material feed and waste system illustrated generally by numeral 54. In contrast to the SDM apparatus shown in FIG. 1, the build platform 14 in this apparatus is reciprocally driven by the conventional drive means 26 instead of the dispensing trolley 20. The dispensing trolley 20 is precisely moved by actuation means 16 vertically to control the thickness of the layers of the object. Preferably, the actuation means 16 comprises precision lead screw linear actuators driven by servomotors. The ends of the linear actuators 16 reside on opposite ends of the build environment 12 and in a transverse direction to the direction of reciprocation of the build platform. However, for ease of illustration in FIG. 2 they are shown in a two-dimensionally flat manner giving the appearance that the linear actuators are aligned in the direction of reciprocation of the build platform 14. Although they may be aligned with the direction of reciprocation, it is preferred they be situated in a transverse direction so as to optimize the use of space within the apparatus.

In the build environment generally illustrated by numeral 12, there is shown by numeral 44 a three-dimensional object being formed with integrally formed supports 46. The object 44 and supports 46 both reside in a sufficiently fixed manner on the build platform 14 so as to sustain the acceleration and deceleration effects during reciprocation of the build platform while still being removable from the platform. It is desirable to dispense at least one complete layer of support material on the build platform 14 before dispensing the build material since the support material is designed to be removed at the end of the build process. The curable phase change build material identified by numeral 22 is dispensed by the apparatus 10 to form the three-dimensional object 44, and the non-curable phase change support material identified by numeral 48 is dispensed to form the support 46. Containers identified generally by numerals 56A and 56B, respectively, hold a discrete amount of these two materials 22 and 48. Umbilicals 58A and 58B, respectively, deliver the material to the dispensing device 24. The materials 22 and 48 are heated to a flowable state, and heaters (not shown) are provided on or in the umbilicals 58A and 58B to maintain the materials in the flowable state as they are delivered to the dispensing device 24. In this apparatus the ink jet print head is configured to dispense both materials from a plurality of dispensing orifices so that both materials can be selectively dispensed in a layerwise fashion to any target location in any layer being formed. When the dispensing device 24 needs additional material 22 or 48, extrusion bars 60A and 60B are respectively engaged to extrude the material from the containers 56A and 56B, through the umbilicals 58A and 58B, and to the dispensing device 24.

The dispensing trolley 20 shown in FIG. 2 comprises a heated planarizer 32 that removes excess material from the layers to normalize the layers being dispensed. The heated planarizer contacts the material in a non-flowable state and because it is heated, locally transforms some of the material to a flowable state. Due to the forces of surface tension, this excess flowable material adheres to the surface of the planarizer, and as the planarizer rotates the material is brought up to the skive 62 which is in contact with the planarizer 32. The skive 62 separates the material from the surface of the planarizer 32 and directs the flowable material into a waste reservoir, identified generally by numeral 64 located on the trolley 20. A heater 66 and thermistor 68 on the waste reservoir 64 operate to maintain the temperature of the waste reservoir at a sufficient point so that the waste material in the reservoir remains in the flowable state.

The waste reservoir is connected to a heated waste umbilical 70 for delivery of the waste material to the waste receptacles 72A and 72B. The waste material is allowed to flow via gravity down to the waste receptacles 72A and 72B. Although only one umbilical 70 with a splice connection to each waste receptacle is shown, it is preferred to provide a separate waste umbilical 70 between the waste reservoir 64 and each waste receptacle 72A and 72B. For each waste receptacle 72A and 72B, there is associated a solenoid valve 74A and 74B, for regulating the delivery of waste material to the waste receptacles. Preferably, the valves 74A and 74B remain closed, and only open when the respective extrusion bars 60A and 60B are energized to remove additional material. A detailed discussion of the feed and waste system is disclosed in U.S. patent application Ser. No. 09/970,956 assigned to the assignee of the present invention.

In FIG. 2 the flash curing system of the present invention is identified generally by numeral 78 and is represented schematically as a lamp or bulb 78. An additional flash curing system is generally shown by numeral 79 and is represented schematically as lamp or bulb 80. Flash curing system 79 is provided separately to expose the waste material in the waste receptacles to radiation to cure the waste material in the waste receptacles. The flash curing system 78 generates at least one planar flash of radiation for each dispensed layer to cure the dispensed build material. Each flash comprises a plurality of radiation emitting pulses having wavelengths between about 200 to 1100 nanometers (nm). Hence the term "flash" as used herein refers to a duration of time in which a plurality of radiation emitting pulses are generated at a selected frequency to initiate curing. For the preferred build material, the radiation emitted at wavelengths between about 200 nm to about 400 nm initiate curing of the dispensed material, and more preferably between about 250 nm to about 330 nm. Each radiation emitting pulse of each planar flash can have a pulse width of between about 10 microseconds ($\mu$s) to about 4 milliseconds (ms), preferably between about 20 $\mu$s to about 200 $\mu$s, more preferably between about 70 $\mu$s to about 150 $\mu$s, and most preferably between about 90 $\mu$s to about 100 $\mu$s.

Each radiation emitting pulse of each planar flash has a peak power value that is greater than the average power of the planar flash. It is believed that these short duration, high peak power pulses of the planar flash, release from the photoinitiators free radicals in such abundance they provide ample free radicals for consumption by the oxygen and for initiating sufficient cross-linking in the build material to cure the build material. Thus, the significant aforementioned problem of oxygen inhibition that occurs when attempting to cure thin layers of materials with a broad planar flash is substantially eliminated.

Three-dimensional objects are formed by a solid freeform apparatus, such as the one shown at 44 in FIG. 2, in a layer-wise manner wherein each layer is exposed to at least one planar flash of radiation generated by the flash curing system 78. Because the flash curing system 78 does not continuously remain on during the formation of the object, a significant amount of energy savings is achieved as well as a significant reduction in heat generation. The duration of the at least one flash may be between about 0.01 to about 2.0 seconds, or more preferably between about 0.5 to about 1.5 seconds, and most preferably about 1.0 second.

In the embodiments discussed in conjunction with the figures, a xenon gas flash lamp is used to generate the radiation emitting pulses. However other gas flash lamps may be used as well, such as xenon-mercury lamps, xenon-metal halide lamps, and the like. Alternatively, ultraviolet light-emitting-diodes (LED) lamps may be used to generate the radiation emitting pulses, if desired. For example, an LED lamp comprised of a blue InGaN/YAG phosphor layer may be used, if desired. In addition, Large-Area Blue LED lamps comprised from InGaN/$Al_2O_3$ layers available from Uniroyal Optoelectronics, LLC of Tampa, Fla. may also be used, if desired.

In another alternative, a microwave-powered UV lamp may be used to generate the radiation emitting pulses, if desired. These lamps are electrode-less and can be used in conjunction with a solid state microprocessor-based modular power supply, which performs the functions of the pulse-forming network, power supply, and trigger. A microwave-powered UV lamp system under the product designation Light Hammer™ 6 available from Fusion UV Systems, Inc., of Gaithersburg, Md., may be used, if desired.

Referring now to FIG. 3, an electrical schematic is provided of the preferred flash curing system of the present invention, identified generally by numeral 90. The curing system utilizes a xenon flash lamp 98 which emits a large amount of spectral energy in short duration pulses. A DC power supply 92 provides direct current voltage to both the pulse-forming network 94 and the trigger 96. The power supply 92 is provided with AC power and converts this to DC power for use by the curing system 90. The power supply 92 was produced by Kaiser Systems, Inc., of Beverly, Mass. according to the specifications provided in Table 2.

TABLE 2

| Charge Rate | 600 Joules/second (Peak) |
| --- | --- |
| Average Power | 482 Watts |
| Output Voltage | 1800 V DC |
| Capacitor Size | 2.5 μF |
| Charge Time | 7 mS for 2.5 μF to reach 1800 V DC |
| Rep-Rate | 120 Hz Internally generated |
| Trigger transformer drive | 450-550 V peak pulse, 0.47 μF storage Capacitor |
| Input Voltage | 90 to 254 Vac ± 10% 50/60 Hz single phase |
| Input Current | <10 A @ 264 Vac |
| Inrush Current | <20 A |
| Efficiency | >80% |
| Power Factor | >98% |
| Operating Temperature | 0° C. to 40° C. |

Alternatively, Kaiser Systems, Inc., of Beverly, Mass., has available standard capacitor charging power supplies and power factor correction filters sold under the designations $LS102_{LV}$ and $LS500_{LV}$ which can be used as the DC power supply, if desired, and/or modified to meet the requirements of any particular flash curing system.

The pulse-forming network 94 of FIG. 3 is generally an R/C circuit connected across electrodes 100 of the xenon flash bulb 98. The pulse-forming network was produced by PerkinElmer Optoelectronics of Salem, Mass. The pulse-forming network was designed to have a capacitance of 2.5 microfarads. During operation, the capacitor of the pulse-forming network is charged by the power supply to a voltage that is lower than that necessary to cause the xenon gas in the bulb to flash. Flashing of the xenon bulb is initiated by the trigger 96, which creates a voltage gradient (Volts/Inch) in the xenon gas in the bulb that causes ionization. In this embodiment, the trigger is a series induction trigger produced by PerkinElmer Optoelectronics under the designation TR-204 series injection transformer. The specifications of the induction trigger are provided in Table 3. However, other triggering configurations may be used, such as an external induction trigger, a pseudo-series injection trigger, an overvoltage spark gap trigger, or a thyratron trigger, if desired.

TABLE 3

| Maximum DC input | 550 V |
| --- | --- |
| Primary peak current | 170 A |
| Hold-off voltage (secondary to primary) | 20 kV (minimum) |
| Secondary DCR | 0.22 ohms |
| Output voltage | 18 kv |
| Rise time 10%-90% | 0.8 μsec |
| Pulse width 50% amplitude | 1.0 μsec |
| Secondary RMS current | 18 A |
| Secondary saturated inductance | 250 μH |

The xenon flash lamp 98 comprises a thermally matched hollow quartz glass tube 102 and sealed electrode ends 104 which encapsulate the xenon gas in the lamp. The electrodes 100 are made of tungsten and reside in the glass tube 102. The electrodes 100 are approximately 10 inches apart. The length of the flash lamp was sized so as to provide illumination across the width of the build environment, which for the SDM apparatus discussed herein is a length of 10 inches. The xenon flash lamp was produced by PerkinElmer Optoelectronics for 3D Systems, Inc. as part number FXQG-1700-10.

Since the design of the SDM apparatus incorporating the flash curing system has a dispensing width of about 7.4 inches, it was decided to direct the planar flash over an area of generally about 10 inches in length and 1 inch width, with the build platform being scanned underneath this area. This relatively slender planar flash configuration tends to minimize radiation reflection within the apparatus which could undesirably initiate cure of the material in critical components of the apparatus, causing system failure. However, the planar area may be larger, for instance, and may cover the entire area of the build platform, if desired. Generally, the length of the lamp (10 inches) was selected to be somewhat greater than the width of the build area (7.4 inches) to assure full cure of the edges of the parts in the build area. This is because, the contaminants generated inside the lamp near the electrode ends caused by electrode degradation start to inhibit passage of radiation emitted near the electrode ends through the lamp. Any lamp length could be used, for example, such as a plurality of short length lamps that are simultaneously flashed to illuminate the desired area over the build platform. Still further, the lamp may helical, spherical, or any other desired shape, if desired.

Referring now to FIG. 4 a reflector housing assembly is shown generally by numeral 104. The reflector housing assembly 104 comprises a reflector 106, a xenon flash lamp 98, a quartz window 108, and wire mesh screen 110. The wire mesh screen is provided to reduce the effects of electromagnetic-interference (EMI) on surrounding electronic systems of the SDM apparatus. The quartz window 108 is secured by the reflector 106 and two endcaps for the assembly (not shown). The reflector 106 is made from aluminum and is shaped in a concentric-elliptical-concentrated (c-e-c) configuration so as to focus the irradiation to a 1 inch width. A cooling flow of air is driven through the space bound by the reflector 106 and the quarts window 108 parallel to the axis of the lamp 98 so as to cool the lamp during operation. Other cooling configurations may be used, as desired, such as providing a flow of liquid such as water through the reflector housing assembly, if needed.

An alternative reflector housing assembly is shown generally by numeral 104 in FIG. 5. In this reflector housing assembly the reflector 106 is designed in a gull wing configuration to focus the irradiation being emitted from the lamp 98. This configuration may also be used to illuminate the desired 10 inch by 1 inch area previously discussed, or any other area, if desired. It is to be appreciated that the configuration of the reflector housing assembly may be tailored to meet any illumination area requirement of any particular SDM apparatus. For example, the housing can provide a planar illumination over a large area and be used in combination with a mask system, such as the mask system disclosed in, for example U.S. Pat. No. 5,287,435, to selectively cure areas of a cross-sectional layer. Thus, the flash curing system of the present invention is not limited for use with selective deposition systems utilizing print heads, or the like, that dispense material in the desired cross-sectional configuration prior to being cured.

Initial tests were conducted to determine pulse parameters that would substantially cure the preferred build material discussed above. A power supply connected to a pulse width generator was attached to a short length (3 inch) xenon flash lamp so as to produce a controllable single pulse emission. The input energy for each pulse was controlled by adjusting the capacitance and voltage on the pulse width generator. The input energy for each pulse was calculated from the equation:

$$E(\text{joules}) = \frac{1}{2} \times C(\text{ferrads}) V^2 \text{ (DC voltage)}.$$

The build material was dispensed in a 1 mil thick layer and the capacitance and voltage values were adjusted in tests to cure the layer. The preferred input energy value for each pulse of the present invention was determined to be in the range between about 1 to about 15 joules, and more preferably between about 1 to about 5 joules of energy for curing the preferred build material, and most preferably about 3.5 to about 4.5 joules of energy. A preferred pulse width of between about 20 to about 200 microseconds was effective in curing the material, and more preferably between about 25 to about 50 microseconds. However when operating with the preferred long arc lamp (10 inches) and low power (486 Watts) power supply, the pulse width range of between about 25 to about 50 microseconds was not achievable. Hence, for the preferred embodiment a pulse width of between about 90 to about 100 microseconds was selected. It is to be appreciated that the optimal pulse width and input energy per pulse will vary for different build material formulations.

The time period for one flash of the system was selected to be one second, which is the time it takes for the reciprocating build platform 14 of FIG. 6 to pass underneath the xenon flash lamp. Thus, within this one second flash the entire build area over the reciprocating build platform 14 passes and is exposed to the radiation pulses of the flash.

The power consumption rate of the present invention flash curing system is preferably less that about 1000 watts, more preferably less than about 800 watts, even more preferably less than about 600 watts, and most preferably less than about 500 watts. It was decided keep the power consumption rate under 500 watts in order to minimize power consumption and heat generation, and also so that the SDM apparatus could operate on standard low voltage service such as 115V/20A. Because the flash emits visible light, the frequency of the pulses of the flash was selected to be 120 Hertz (Hz) in order to conform to the standard frequency for most lighting systems which prevents vertigo effects in humans. Hence, at this frequency, the 1-second flash appears as a 1-second continuous visible light emission, when in reality a plurality of pulses across the electromagnetic spectrum are being emitted. However it is to be appreciated that the pulse frequency may be any desired rate greater or lower than 120 Hz, if desired.

Thus, for each flash time period (1 second) in the preferred embodiment the xenon flash bulb actually performs 120 pulses, each pulse having a width of about 100 µs. Hence, the pulses are off about 8.2 milliseconds. Thus, the power supply 92 has a very fast charge rate (less than 8.2 ms) in order to recharge the pulse-forming network 94 between pulses. The average power consumed by the xenon flash bulb is calculated by the following equations:

$$P_{avg}(\text{watts}) = E(\text{joules}) \times f(\text{frequency Hz}) \text{ where}$$

$$E(\text{joules}) = \frac{1}{2} \times C(\text{ferrads}) V^2 \text{ (DC voltage)}.$$

For the xenon flash curing system disclosed above, the calculated average power consumption rate is about 486 watts $((\frac{1}{2} \times (2.5 \times 10^{-6}) (1,800)^2) \times 120)$ for each flash. This is below the desired 500-watt limit, although any flash curing system according to the present invention can operate at power levels up to as high as about 1000 watts, if desired.

The average energy density of the radiation emitted from the pulses on a per second basis within the ultraviolet wavelength band of between about 200 nm to about 400 nm can be between about 400 J/s cm$^2$ to about 6,000 J/s cm$^2$ for curing the preferred build material. For the embodiment disclosed this value was determined to be about 1,600 J/s cm$^2$ for a wavelength range of between about 200 nm to about 400 nm, and about 539 J/s cm$^2$ for a wavelength range of between about 250 nm to about 330 nm. The desired wavelength for curing material can be any range within the spectral distribution of the flash, preferably within the ultraviolet to visible light range, but most preferably within the ultraviolet range. Hence, the desired wavelength range will vary depending on the type of photoinitiator(s) used in the formulation.

The average energy density of the pulses on a per second basis within the ultraviolet wavelength band was determined in steps. First, the spectral distribution of the flash curing system was measured over generally the entire range of wavelength emissions. This was done to determine a percentage of irradiance within each range of wavelengths. Next, optical energy measurements were made to determine the overall energy density per pulse. The percentage of irradiance for the desired wavelength was then multiplied by the energy density per pulse and normalized on a 1 second basis (divided by 1 second) to arrive at the average energy density of the pulses on a per second basis within the ultraviolet wavelength band.

The spectral distribution of the flash curing system was measured with a MultiSpec ⅛-metre spectrometer available from Oriel Instruments, Corp., of Strafford, Conn. This spectrometer was an F/3.7 system having a 1024 element photodiode array. The slit width was set at 50 microns, the half-angle of the system was about 7.7 degrees, and the exposure time was set at 60 milliseconds. The spectrometer was placed about 1 inch from the front of the reflector, which is about 2.1 inches away from the xenon lamp. The spectrometer automatically normalizes all irradiance readings relative to one second. Spectrum measurements were taken in 50 nm wavelength increments for the range of wavelengths between 200 nm to 80 nm, which generally covered the entire spectrum range of emission from the flash curing system. The exposure time was multiplied by the irradiance values ($\mu W/cm^2$) to arrive at the energy density per flash and then irradiance percentages were calculated for each wavelength increment range. The measured and calculated values are provided in Table 4.

TABLE 4

| Wavelength Region (nm) | Irradiance ($\mu W/cm^2$) | Irradiance ($\mu J/cm^2$/flash) | % of 200-800 nm |
|---|---|---|---|
| 200-250 nm | 136.8 | 8.21 | 2.3 |
| 250-300 nm | 218.8 | 13.1 | 3.7 |
| 300-350 nm | 345.7 | 20.7 | 5.8 |
| 350-400 nm | 559.4 | 33.6 | 9.5 |
| 400-450 nm | 641.4 | 38.5 | 10.8 |
| 450-500 nm | 757.3 | 45.4 | 12.8 |
| 500-550 nm | 647.6 | 38.9 | 10.9 |
| 550-600 nm | 589.1 | 35.3 | 10.0 |
| 600-650 nm | 545.0 | 32.7 | 9.2 |
| 650-700 nm | 511.0 | 30.7 | 8.6 |
| 700-750 nm | 503.8 | 30.2 | 8.5 |
| 750-800 nm | 461.1 | 27.7 | 7.8 |
| 200-400 nm | 1260.7 | 75.6 | 21.3 |
| 200-800 nm | 5917.0 | 355.0 | 100 |

Optical energy measurements were then made using a J25LP-Ruby joulemeter available from Molectron Detector, Inc., of Portland, Oreg. The joulemeter had a flat spectral response that can make energy measurements in the spectral range of between 200 nm to 20,000 nm. The joulemeter had a detector area of 5.067 $cm^2$, and was placed 2.1 inches away from the xenon lamp. Measurements were taken under the same conditions as discussed in conjunction with the measurements taken in determining the spectral distribution. Measurements were also taken with a Schott RG-780 filter placed in front of the detector, which blocks emissions below 780 nm. The Schott RG-780 filter is available from Bes Optics, Inc., of W. Warwick, R.I. The measurements with the filter were used to calculate the percentage of energy emissions above and below a wavelength of about 800 nm. Since only 90% of the emissions above 800 nm are transmitted through the filter, the output measurement was adjusted to take this into account.

The optical energy emission of the flash curing system was 81 millijoules (mJ) per pulse measured without the filter, 38.4 mJ per pulse with the filter, and 42.7 mJ per pulse with the filter when adjusted to account for the 90% emission of the filter. With these values it was then determined that about 53% (42.7/81) of optical energy is emitted at wavelengths above 800 nm, and about 47% ((81−42.7)/81) of the optical energy is emitted below 800 nm. The energy per pulse below wavelengths of 800 nm is about 38.1 mJ (81 mJ×0.47), and the energy density per pulse below wavelengths of 800 nm is about 7.5 mJ/$cm^2$ (38.1 mJ/5.067 $cm^2$). The energy density per pulse for the desired ultraviolet wavelength ranges are calculated as shown in Table 5.

TABLE 5

| Wavelength Region (nm) | % Irradiance from Table 4 | Total Energy density per pulse (200-800) nm | Irradiance ($\mu J/cm^2$/pulse) |
|---|---|---|---|
| 200-250 nm | 2.3 | 7.5 mJ/$cm^2$ | 173 |
| 250-300 nm | 3.7 | 7.5 mJ/$cm^2$ | 278 |
| 300-350 nm | 5.8 | 7.5 mJ/$cm^2$ | 435 |
| 350-400 nm | 9.5 | 7.5 mJ/$cm^2$ | 713 |
| 200-400 nm | 10.8 | 7.5 mJ/$cm^2$ | 1600 |

With the data in Table 5, the average energy density of the radiation emitted from the pulses on a per second basis can be determined for any given wavelength. For example, between the wavelengths of between about 250 nm to about 330 nm, the average energy density of the radiation emitted from the pulses on a per second basis can be determined as follows:

$$E_{density\ per\ second} = [278+435(0.6)]\mu J/cm^2/\text{pulse} \times (1/1\ \text{second}) = 539\ J/s\ cm^2$$

In the ultraviolet radiation wavelength range of between about 200 nm to about 400 nm, the energy density of radiation emitted from the pulses on a per second basis was determined to be about 1600 J/s $cm^2$. From this value a working range for the average energy density was determined. Because the input energy value for each pulse in the most preferred embodiment is about 4 joules, but can be between about 1 to about 15 joules per pulse, the ratio within this range provides a working range of the average energy density of the pulses on a per second basis that can be used to cure the build material of the preferred embodiment. Thus, the average energy density of the pulses on a per second basis within the ultraviolet wavelength band of between about 200 nm to about 400n of any flash curing system for curing the preferred build material can be between about 400 J/s $cm^2$ (1600×1/4×(1/1 second)) to about 6,000 J/s $cm^2$ (1600×15/4 (1/1 second)).

It is to be appreciated that energy emissions from the pulses at wavelengths beyond the ultraviolet radiation range may be relied upon to cure other material formulations, if desired. For instance, since there are photoinitiators that react to infrared and visible light radiation wavelengths, these wavelengths could be relied upon to cure a material containing such photoinitiators. Generally, if the energy density on a per second basis of the pulses in the ultraviolet radiation band of between about 200 nm to about 400 nm is between about 400 J/s $cm^2$ to about 6,000 J/5 $cm^2$ there will be sufficient energy emission in the other wavelength bands to cure most any SDM material.

The peak power emitted for a given pulse between the radiation wavelengths of between about 250 nm to about 330 nm was measured at a frequency of 1 Hz and was determined to be about 5 W/$cm^2$. It is believed this nearly instantaneous high power pulse releases free radicals from the photoinitiator so quickly and in such quantity to not only satisfy the consumption of free radicals by the oxygen, but also satisfy the photoinitiation requirements for curing the material.

The xenon flash lamp discussed above has a very broad bandwidth of radiation emissions, between wavelengths of about 200 nm to about 1100 nm where most all of the emissions are between wavelengths about 250 to about 800. However, the emissions that are utilized to generate free radicals from photoinitiators that initiate curing are generally in the ultraviolet radiation range of between about 200 nm to about 400 nm. Of the total ultraviolet emission range (200 nm to 400 nm) produced by the xenon flash lamp only about 5% is in the short wavelength band UV-C and UV-B, which is between about 200 nm to about 300 nm. The other 95% is in the longer wavelength band UV-A, which is between about 300 nm to about 400 nm.

When curing the preferred build material with the xenon flash lamp, only the short wavelength band, generally between about 200 nm to about 300 nm initiates curing since the selected photoinitiator I-184 releases free radicals only when exposed to the short wavelength band. Although the system is less efficient with short wavelength band photoinitiators, these photoinitiators are generally preferred because they tend to be more thermally stable. However, the xenon flash lamp is well suited for use in curing other formulations containing photoinitiators that are excitable in the longer wavelength band UV-A, between about 300 nm to about 400 nm, such as the 1-369 photoinitiator available from Ciba Specialty Chemicals, Inc. of New York, N.Y. Further, these and other photoinitiators can be combined to formulate a material wherein cure is initiated for wavelengths in the entire UV band, for example between about 200 nm to about 400 nm, if desired.

Referring now to FIG. 6 the reflector housing assembly 104 is shown schematically in the cross-section along with the dispensing device 24 and the planarizer 32 mounted on the dispensing trolley 20 in operative association with the reciprocating build platform 14 of the SDM apparatus previously discussed in conjunction with FIG. 2. The Z850 print head dispensing device 24 has an array of 448 dispensing jets divided into 112 banks, each bank having four jets. For each bank, two jets are configured to dispense the build material and the other two are configured to dispense the support material. There are a total of 2,688 raster lines required to cover the width of the dispensing area for the apparatus, which is 7.4 inches. With a total of 2688 raster lines that the print head must cover to form a layer, each bank of four jets is assigned to dispense over 24 raster lines (2688/112). For each column of four jets to cover the 24 raster lines assigned to it, the print head is shifted in the direction normal to the plane of the cross-sectional view of FIG. 6 a distance of one raster line at the end of reciprocation of the build platform 14, whose end locations are shown by numerals 112 (right) and 114 (left). Thus, it takes 12 reciprocal passes of the build platform 14 under the print head so that all 2688 raster lines can be dispensed with either build material or support material by the print head to form a layer.

It is to be appreciated that in the preferred embodiment planarizing only occurs when the build platform reciprocates in one direction, such as from left to right in FIG. 6. Hence, planarizing occurs on every other reciprocal pass so that each layer is planarized six times. The reflector housing assembly 104 will then reside on the side where planarization of the object 44 has already occurred, which in FIG. 6 is on the left. Because the build platform 14 must reciprocate 12 times for a complete layer to be dispensed, the flash curing system can flash only when the build platform has returned to the left side. Flashing can occur either as the build platform moves from right to left towards the left end of reciprocation 114, or after the build platform reaches the left end of reciprocation 114 and starts to move from left to right. Alternatively, the flash curing system need not flash on every return. In particular, the flash curing system can be selectively configured to flash at any desired interval with regard to the 12 reciprocal passes of the build platform. In order to minimize heat generation and power usage, it is desirable to flash the system only upon the last reciprocal pass (twelfth) of the build platform for establishing a layer. However, other considerations for optimizing the system, for instance, reducing the localized mixing of dispensed build and support material caused by the planarizer during the 12 passes may require executing a flash on every return or at some other desired interval. For example, one staggered interval that has been shown to be effective in minimizing mixing is to flash on the 2nd, 6th, 8th, and 12th pass.

As used herein, the "duty cycle" of the flash curing system refers to the percentage of the total amount of time the planar flash (or flashes) remains on for forming a layer compared to the total time it takes to form the layer. The prior art continuously emitting systems utilizing mechanical shutters have a duty cycle of 100% since they remain on throughout the layer forming process.

Generally it takes approximately 24 seconds to dispense a layer of material with the SDM apparatus discussed in conjunction with FIGS. 2 and 6. If the flash curing system flashes just once when forming a layer, the flash curing system is only on for one second which is approximately 4.1% ((1/24)×100) of the time it takes to complete a layer. This is a duty cycle of about 4.1%. If the flash curing system flashes on every other reciprocation of the build platform, the flash curing system is on for six seconds which is approximately about 25% ((6/24)×100) of the time it takes to complete a layer. This is a duty cycle of about 25%. Compared to continuously emitting UV lamps, which have a 100% duty cycle, any flash curing system will have a duty cycle of less than 100% and will therefore save power and reduce heat generation. The duty cycle for the flash curing system of the present invention is always less than 100%, and is preferably between about 4.1% to about 25%.

The present flash curing system reduces the time in which the flash curing system is on by approximately about 93.9% (100%-4.1%) to about 75% (100%-25%) of the time it takes to complete a layer compared to continuously emitting UV lamp systems. Thus, the present flash curing system can utilize between about 93.9% to about 75% less power than continuously emitting UV lamp systems assuming the average power requirements of both types of systems are the same. However, the average power requirements of the present invention flash curing system (i.e. 486 watts) is much less than that of an equivalent continuously emitting UV system (i.e. 1500 watts). This average power savings is approximately about 74% ((1500-390)/1500) and is believed to be obtained because the flash curing system comprises a plurality of high peak power pulses that initiate cure in which the average power consumed is substantially less than the peak power of the pulses.

In an alternative embodiment, a pulsed flash curing system sold under the designation TDS606 RC-600 available from Xenon Corporation, of Woburn, Mass., may be used, if desired. This system was designed for mass production line use in the semiconductor industry for ion implantation, in the food and beverage industry for sterilization, and in the medical industry for sterilization. This system has an input power requirement of about 600 watts, and operates at about 2250 V dc with a capacitance of 2 about microferrads (µf) at a pulse width of 25 µs. This system also uses a 10-inch long xenon gas flash lamp and may be used, if desired.

Figure 7:
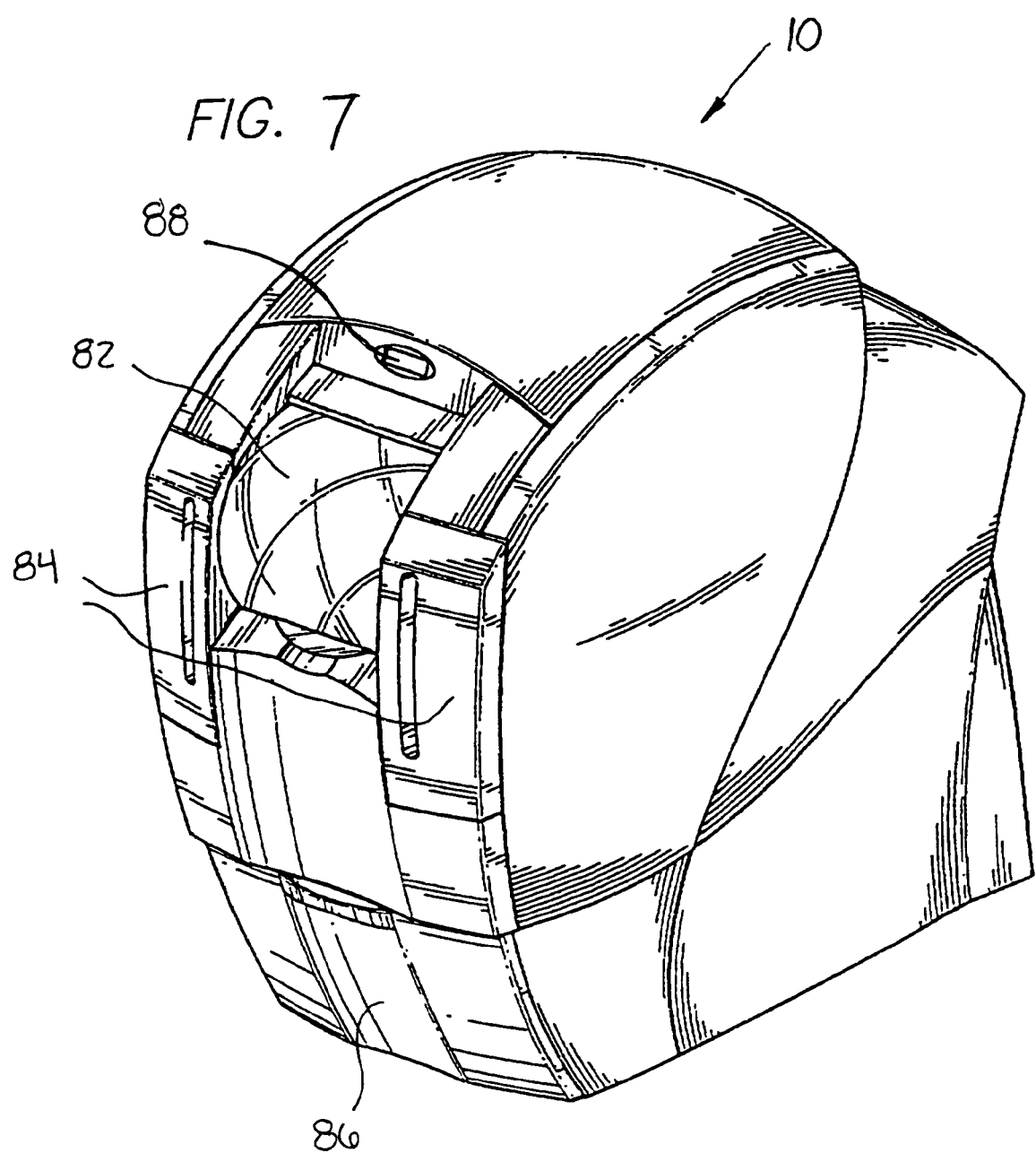
FIG. 7 is an isometric view of the apparatus of FIG. 2 for practicing the present invention.

Now referring to FIG. 7, the SDM apparatus schematically shown in FIG. 2 is shown as 10. To access the build environment, a slideable door 82 is provided at the front of the apparatus. The door 82 does not allow radiation within the apparatus to escape into the environment. The apparatus is configured such that it will not operate or turn on with the door 82 open. In addition, when the apparatus is in operation, the door 82 will not open. Material feed doors 84 are provided so that the curable phase change material can be inserted into the apparatus through one door 84 and the non-curable phase change material can be inserted into the apparatus through the other into their respective feed magazines (not shown). A waste drawer 86 is provided at the bottom end of the apparatus 10 so that the expelled waste material can be removed from the apparatus. A user interface 88 is provided which is in communication with the external computer previously discussed which tracks receipt of the print command data from the external computer.

All patent applications, patents, and other publications cited herein are incorporated by reference in their entirety. What has been described are preferred embodiments in which modifications and changes may be made without departing from the spirit and scope of the accompanying claims.

What is claimed is:

1. A method of forming a three-dimensional object in a layerwise manner in a build environment, the method comprising the steps of:
   generating computer data corresponding to layers of the object;
   selectively dispensing a curable build material and a non-curable support material from a jetting print head in the build environment according to the computer data to form layers of the object;
   supporting the dispensed material in the build environment;
   exposing the dispensed material to at least one planar flash of radiation to cure the dispensed material, the planar flash comprising a plurality of radiation emitting high peak power pulses to release an effective amount of free radicals to overcome oxygen inhibition and to initiate curing of the dispensed material; and
   consuming less than about 500 watts of power when exposing the dispensed material to the at least one planar flash.

2. The method of claim 1 further comprising providing between about 1 joule to about 15 joules of input energy for generating each radiation emitting pulse.

3. The method of claim 1 further comprising providing between about 1 to about 5 joules of input energy for generating each radiation emitting pulse.

4. The method of claim 1 further comprising providing about 3.5 to about 4.5 joules of input energy for generating each radiation emitting pulse.

5. The method of claim 1 further comprising emitting an average energy density of between about 400 J/s cm$^2$ to about 6,000 J/s cm$^2$ from the pulses on a per second basis within the wavelength band of between about 200 nm to about 400 nm.

6. The method of claim 1 further comprising emitting radiation emitted from the pulses between the wavelengths of between about 200 to about 400 nanometers to initiate curing of the dispensed material.

7. The method of claim 1 further comprising the radiation emitting pulses each having a pulse width of between about 10 microseconds to about 4 milliseconds.

8. The method of claim 1 further comprising the radiation emitting pulses each having a pulse width of between about 20 to about 200 microseconds.

9. The method of claim 1 further comprising the radiation emitting pulses each having a pulse width of between about 70 to about 150 microseconds.

10. The method of claim 1 further comprising the radiation emitting pulses each having a pulse width of between about 90 to about 100 microseconds.

11. The method of claim 1 further comprising applying the at least one planar flash for a duration having a duty cycle of less than 100%.

12. The method of claim 1 further comprising applying the at least one planar flash for a duration having a duty cycle between about 4.1% and about 25%.

13. The method of claim 1 further comprising providing the at least one planar flash with a duration of between about 0.01 to about 2.0 seconds.

14. The method of claim 1 further comprising providing the at least one planar flash with a duration of between about 0.5 to about 1.5 seconds.

15. The method of claim 1 further comprising providing the at least one planar flash with a duration of about 1 second.

16. The method of claim 6 further comprising using a lamp to expose a planar area of at least about 10 square inches in the build environment.

17. A method of forming a three-dimensional object in a layerwise manner in a build environment, the method comprising the steps of:
   generating computer data corresponding to layers of the object;
   selectively dispensing a curable build material and a non-curable support material from a jetting print head in the build environment according to the computer data to form layers of the object;
   supporting the dispensed material in the build environment;
   exposing the dispensed material to at least one planar flash of radiation to cure the dispensed material, the planar flash comprising a plurality of radiation emitting high peak power pulses to release an effective amount of free radicals to overcome oxygen inhibition and to initiate curing of the dispensed material; and
   providing between about 1 joule to about 15 joules of input energy for generating each radiation emitting pulse.

18. The method of claim 17 further comprising providing between about 1 to about 5 joules of input energy for generating each radiation emitting pulse.

19. The method of claim 17 further comprising providing about 3.5 to about 4.5 joules of input energy for generating each radiation emitting pulse.

20. The method of claim 17 further comprising emitting an average energy density of between about 400 J/s cm$^2$ to about 6,000 J/s cm$^2$ from the pulses on a per second basis within the wavelength band of between about 200 nm to about 400 nm.

21. The method of claim 17 further comprising emitting radiation from the pulses between the wavelengths of between about 200 to about 400 nanometers to initiate curing of the dispensed material.

22. The method of claim 17 further comprising the radiation emitting pulses each having a pulse width of between about 10 microseconds to about 4 milliseconds.

23. The method of claim 17 further comprising the radiation emitting pulses each having a pulse width of between about 20 to about 200 microseconds.

24. The method of claim 17 further comprising the radiation emitting pulses each having a pulse width of between about 70 to about 150 microseconds.

25. The method of claim 17 further comprising the radiation emitting pulses each having a pulse width of between about 90 to about 100 microseconds.

26. The method of claim 17 further comprising applying the at least one planar flash for a duration having a duty cycle of less than 100%.

27. The method of claim 17 further comprising applying the at least one planar flash for a duration having a duty cycle between about 4.1% and about 25%.

28. The method of claim 17 further comprising providing the at least one planar flash with a duration of between about 0.01 to about 2.0 seconds.

29. The method of claim 17 further comprising providing the at least one planar flash with a duration of between about 0.5 to about 1.5 seconds.

30. The method of claim 17 further comprising providing the at least one planar flash with a duration of about 1 second.

31. The method of claim 17 further comprising using a lamp to expose a planar area of at least about 10 square inches in the build environment.

\* \* \* \* \*